US012584206B2

(12) United States Patent (10) Patent No.: US 12,584,206 B2
Zimmermann (45) Date of Patent: Mar. 24, 2026

(54) METHOD FOR COATING A PLUMBING COMPONENT

(71) Applicant: Grohe AG, Hemer (DE)

(72) Inventor: Christian Zimmermann, Hemer (DE)

(73) Assignee: GROHE AG, Hemer (DE)

( * ) Notice: Subject to any disclaimer, the term of this patent is extended or adjusted under 35 U.S.C. 154(b) by 154 days.

(21) Appl. No.: 18/270,308

(22) PCT Filed: Mar. 3, 2022

(86) PCT No.: PCT/EP2022/055442
§ 371 (c)(1),
(2) Date: Jun. 29, 2023

(87) PCT Pub. No.: WO2022/184848
PCT Pub. Date: Sep. 9, 2022

(65) Prior Publication Data
US 2024/0084436 A1 Mar. 14, 2024

(30) Foreign Application Priority Data
Mar. 4, 2021 (DE) ..................... 10 2021 105 192.4

(51) Int. Cl.
*C23C 28/02* (2006.01)
*C23C 14/06* (2006.01)
*C23C 28/00* (2006.01)

(52) U.S. Cl.
CPC ............ *C23C 14/06* (2013.01); *C23C 28/021* (2013.01); *C23C 28/023* (2013.01); *C23C 28/321* (2013.01); *C23C 28/343* (2013.01)

(58) Field of Classification Search
None
See application file for complete search history.

(56) References Cited

U.S. PATENT DOCUMENTS

| | | | |
|---|---|---|---|
| 2011/0165435 A1 | 7/2011 | Rost | |
| 2012/0141821 A1 | 6/2012 | Rost et al. | |
| 2016/0168740 A1 | 6/2016 | Manera et al. | |
| 2017/0159198 A1 | 6/2017 | Miettinen et al. | |
| 2019/0055664 A1* | 2/2019 | Zimmermann | ....... C23C 28/343 |

FOREIGN PATENT DOCUMENTS

| | | | |
|---|---|---|---|
| CN | 109072448 | 12/2018 | |
| DE | 44 30 430 | 12/1995 | |
| DE | 102005041375 A1 * | 3/2007 | .............. C25D 7/00 |
| DE | 10 2008 046 673 | 3/2010 | |

(Continued)

OTHER PUBLICATIONS

International Search Report mailed Jun. 15, 2022 in International (PCT) Application No. PCT/EP2022/055442, with English translation.

*Primary Examiner* — David P Turocy
(74) *Attorney, Agent, or Firm* — Wenderoth, Lind & Ponack, L.L.P.

(57) ABSTRACT
A method for coating a plumbing component (1), comprising at least the following steps:
  a) providing the plumbing component (1), wherein the plumbing component (1) has at least one liquid channel (2); and
  b) at least partially coating an inner surface (3) of the at least one liquid channel (2) with a coating (4), wherein the coating (4) has at least one layer (5), which comprises copper.

10 Claims, 1 Drawing Sheet

(56)        References Cited

FOREIGN PATENT DOCUMENTS

Figure 1:
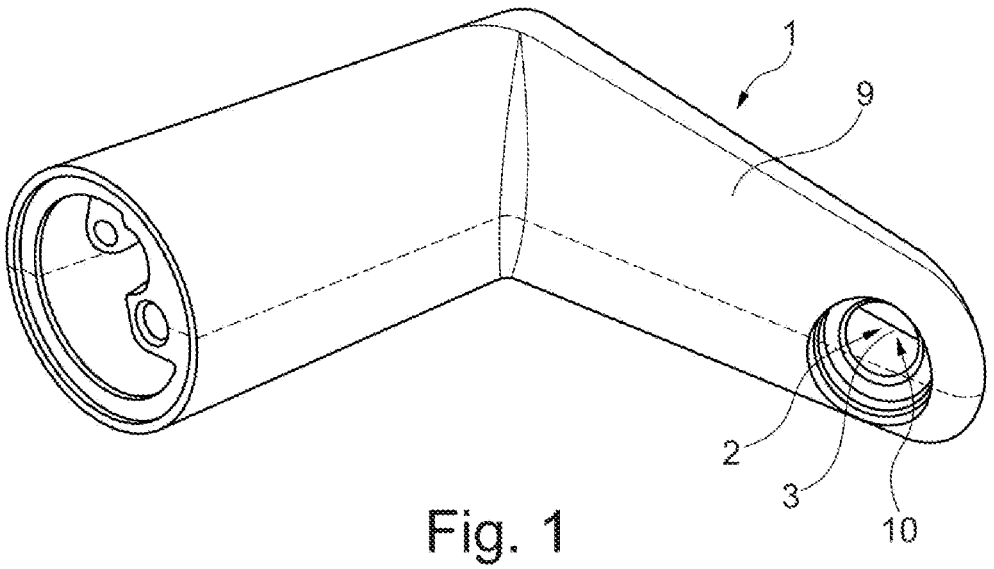

DE      10 2016 004 913          10/2017
EP             2 460 908            6/2012
EP             2 532 771  A2     12/2012
EP             2 532 771  A3     12/2012
EP             3 879 004            9/2021
WO           2017/182123          10/2017
WO      WO-2017182123  A1  *  10/2017    ........... C23C  28/023

* cited by examiner

METHOD FOR COATING A PLUMBING COMPONENT

The present invention relates to a method for coating a plumbing component. For instance, the plumbing component may be a faucet housing for a sanitary faucet, by means of which a liquid may be provided on demand at a wash basin, sink, a shower, and/or bathtub.

Plumbing components may have liquid channels, by means of which the liquid, for instance water, can be supplied to an outlet opening of the plumbing component or of the sanitary faucet. In the process, the liquid comes into contact with a material of the plumbing component, so that components of the material, in particular alloy components of the material, such as lead, can be absorbed by the liquid. However, this is not desirable, since these components can be harmful to health.

Based thereon, this invention addresses the problem of at least partially solving the problems indicated with reference to the prior art and specifying in particular a method for coating a plumbing component, with which a release of components of the material of the plumbing component to the liquid can at least be reduced.

This problem is solved by a method according to the features of the independent claim. Further advantageous embodiments of the invention are specified in the dependent claims. It will be appreciated that the features listed individually in the individual claims may be combined in any technologically useful manner and define further embodiments of the invention. In addition, the features indicated in the claims are further specified and explained in the description, wherein further preferred embodiments of the invention are illustrated.

A method for coating a plumbing component having at least the following steps contributes to solving the problem:

a) providing the plumbing component, wherein the plumbing component has at least one liquid channel; and b) at least partially coating an inner surface of the at least one liquid channel with a coating, wherein the coating has at least one layer comprising copper.

For instance, the plumbing component may be a faucet housing for a sanitary faucet. Such a sanitary faucet is used to provide a liquid on demand, in particular water, at a wash basin, sink, shower and/or bathtub. Furthermore, the sanitary faucet is used in particular for tapping or discharging the liquid.

The plumbing component can be made at least partially of metal and/or formed in the manner of a cast component. In this connection the plumbing component or a material of the plumbing component may contain lead, for instance as an alloy element. The plumbing component may be made at least partially of plastic and/or formed in the manner of a plastic injection molding part.

The sanitary faucet may comprise at least one control element for a water temperature and/or a removal volume of the water.

Furthermore, the sanitary faucet may be used in a visible region of a user, so that the plumbing component may be embodied in the manner of a surface mounted component. Alternatively, the plumbing component may also be embodied as a flush mounted component. Such flush mounted components may be installed for instance in a building wall, so that (in an installed state) users generally cannot see said components.

The plumbing component has at least one liquid channel for the liquid. The liquid channel may be embodied in particular by the plumbing component and/or in the plumbing component. Furthermore, the at least one liquid channel is not a separate component of the plumbing component. Instead, the at least one liquid channel may be integrally formed with the plumbing component. The at least one liquid channel may be embodied as a cavity in the plumbing component. Furthermore, the at least one liquid channel may be embodied at least partially in the manner of a drilled hole. In addition, the at least one liquid channel may extend for instance at least partially through an outlet of the plumbing component or of the faucet housing. Moreover, the at least one liquid channel may extend for instance from a receiving chamber for at least one function component of the plumbing component to the outlet opening. In addition, the at least one liquid channel may be limited at least partially by the plumbing component or by a material of the plumbing component. For instance, the liquid of an outlet opening of the plumbing component or of the sanitary faucet may be supplied by means of the liquid channel. In this connection, the liquid may in particular come into contact with a material of the plumbing component.

In a step a) the plumbing component is provided. This may comprise the production of the plumbing component (uncoated or in semi-manufactured form). Step a) may comprise the alignment and/or positioning of the plumbing component in an environment, in which then step b) may be carried out (immediately).

Subsequently or immediately afterwards, in step b) an inner surface of the at least one liquid channel is at least partially furnished with a coating. The inner surface of the at least one liquid channel is at least partially or completely coated with the coating. In this step, an outer surface of the plumbing component may also be at least partially coated with the coating. The at least partial coating of the inner surface of the at least one liquid channel can occur simultaneously with the at least partial coating of the outer surface of the plumbing component. The coating of the inner surface of the at least one liquid channel can be restricted to a region in which the at least one liquid channel flows to the outer surface of the plumbing component. For instance, this region may have a maximum length of 10 cm (centimeters) from the outer surface of the plumbing component along the at least one liquid channel, preferably a maximum length of 5 cm.

The coating produced (in step b) has at least one layer, which comprises copper. Hence, the coating may consist of a single layer of copper, which is applied in particular directly on the inner surface of the at least one liquid channel. The coating may be formed of a plurality of layers. In this case, the coating may be a multilayer system, which can be used to produce in particular decorative and/or functional surfaces. The individual layers are to this end in particular sequential and/or differ in their material composition. The layer of copper and/or the individual layers preferably each have a layer thickness of 1 μm (micrometers) to 60 μm, preferably 4 μm to 40 μm.

For this purpose, the plumbing component may in particular be at least partially dipped in an electrolytic solution. The layer of copper and/or the individual layers of the coating may be electrolytically deposited on the inner surface of the at least one liquid channel and/or of the outer surface of the plumbing component.

In the region of the coating, any contact of the liquid with the material of the plumbing component may be prevented, so that no hazardous components of the material of the plumbing component can be absorbed by the liquid.

The plumbing component may consist of copper or a copper alloy. The copper alloy may comprise zinc, for instance. Furthermore, the copper alloy may be brass or bronze.

The coating may comprise a first layer of copper. The first layer of copper is embodied in particular directly on the inner surface of the at least one liquid channel and/or of the outer surface of the plumbing component.

The coating may comprise a second layer of a nickel phosphorous alloy. The second layer may be embodied in particular directly on the first layer. A mass fraction of the phosphorus in the nickel phosphorous alloy may be in particular at least 8%. The mass fraction of the phosphorus in the nickel phosphorous alloy is preferably 8% to 14%, especially preferably 10% to 12%. The second layer of the nickel phosphorous alloy is in particular electrolytically deposited on the plumbing component. The nickel phosphorous alloy assumes in particular the function of corrosion protection. Hence, the nickel phosphorus alloy prevents to a great extent corrosion on the plumbing component and hence improves the corrosion properties of decorative coatings with functional character. Therefore, damages, incompletely sealed or porous coatings lead to a considerably reduced corrosion trend of the plumbing component, so that a component failure and/or optical defects are avoided. The coating has in particular (where applicable with the exception of the layer of nickel phosphorous alloy) no further layer comprising nickel.

The coating can comprise a third layer of chromium. The third layer is in particular formed directly on the second layer.

The chromium of the third layer can be deposited from hexavalent or trivalent chromium electrolyte.

The coating can comprise a fourth layer from a zirconium compound, chromium compound or titanium compound. Mixtures of these compounds are also possible in the fifth layer. The fifth layer is in particular directly applied to the fourth layer. The purpose of this coating is in particular the creation of a specified color. For instance, shades of red, shades of gold or stainless-steel finish are implemented with said coating. The composition of these layers determines in this connection the achieved color. In different proportions these layers usually consist of zirconium nitride (ZrN), titanium nitride (TiN) and/or chromium nitride (CrN).

The fourth layer can be produced by physical vapor deposition (PVD process).

The fourth layer can be produced from an amorphous carbon layer. The amorphous carbon layer is in particular a diamond-like carbon layer (DLC="diamond-like carbon").

A brushed texture can be incorporated in the coating. The application of a brushed texture is usually implemented in conjunction with the aforementioned PVD-coating. Resulting surface finishes are for example "brushed stainless steel" or "brushed nickel". The brushing is carried out by pressing the objects on rotating disks. The disks can for example be polishing rings with corresponding polishing pastes, fiber brushes or sisal brushes. This work step is carried out prior to the PVD-coating or even prior to the chromium plating.

According to a further aspect, a plumbing component is also proposed, which was produced with the method disclosed here and/or has the layer structure of the coating of an inner surface of the at least one liquid channel disclosed here.

The invention and the technical environment are explained in more detail below with reference to the figures. It should be noted that the figures show a particularly preferred embodiment variant of the invention, but the invention is not limited thereto. In an exemplary and schematic manner:

FIG. 1: shows a perspective view of a plumbing component; and

Figure 2:
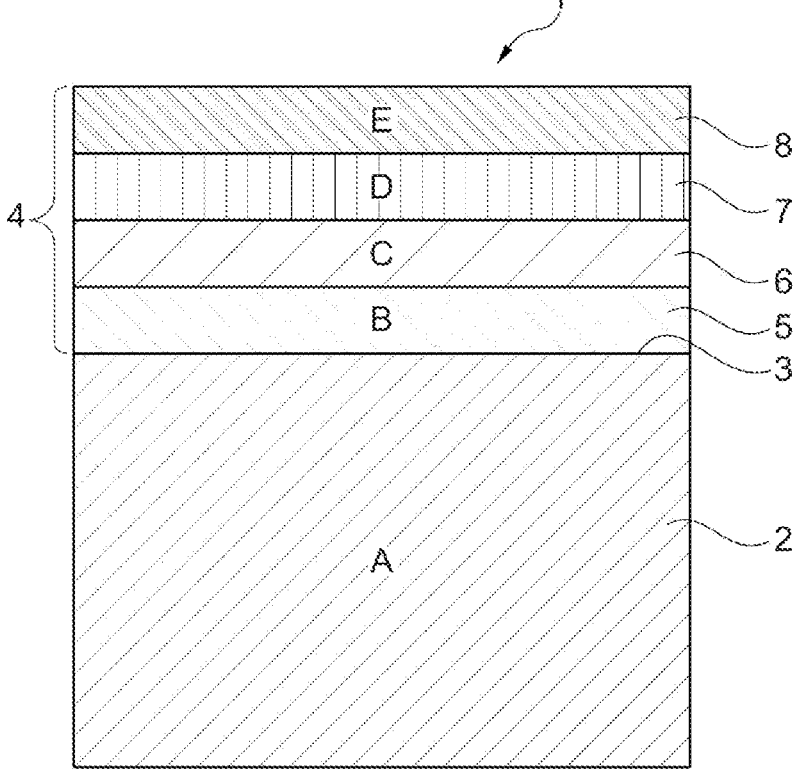

FIG. 2: shows a sectional representation of an inner surface of a liquid channel of the plumbing component having a coating.

FIG. 1 shows a perspective view of a plumbing component 1. The plumbing component 1 is a faucet housing with an outlet 9. The outlet 9 comprises an outlet opening 10, at which a liquid channel 2 opens, which extends through the outlet 9. An inner surface 3 of the liquid channel 2 has a coating 4 shown in FIG. 2 in the region of the outlet opening 10.

FIG. 2 shows the inner surface 3 of the liquid channel 2 of the plumbing component 1 in a sectional representation. The inner surface 3 is coated with a coating 4, which has a first layer 5, a second layer 6, a third layer 7 and a fourth layer 8. In the case of the embodiment variant of the invention proposed here, the plumbing component 1 is made of brass, the first layer 5 of copper, the second layer 6 of a nickel phosphorous alloy, the third layer 7 of chromium and the fourth layer 8 is formed from a zirconium compound.

By means of the present invention, a discharge of components of the material of the plumbing component to the liquid can at least be reduced.

LIST OF REFERENCES 1 plumbing component
2 liquid channel
3 inner surface
4 coating
5 first layer
6 second layer
7 third layer
8 fourth layer
9 outlet
10 outlet opening

The invention claimed is:

1. A method for coating, comprising:
    a) providing a plumbing component (1) comprising at least one liquid channel (2); and
    b) at least partially coating an inner surface (3) of the at least one liquid channel (2) with a coating (4),
    wherein the coating (4) consists of a first layer (5) consisting of copper directly coated on the inner surface (3) of the at least one liquid channel (2), and a second layer (6) consisting of a nickel phosphorus alloy directly coated on the first layer (5), and optionally a third layer (7) consisting of chromium directly coated on the second layer (6), optionally, when the third layer (7) is present, a fourth layer (8) consisting of a zirconium compound, a chromium compound or a titanium compound directly coated on the third layer (7), and optionally, when the third layer (7) and the fourth layer (8) are present, a fifth layer consisting of a mixture of a zirconium compound, a chromium compound and a titanium compound directly coated on the fourth layer (8).

2. The method according to claim 1, wherein the plumbing component (1) is made of copper or a copper alloy.

3. The method according to claim 1, wherein the third layer (7) is present.

4. The method according to claim 3, wherein the chromium is deposited from hexavalent or trivalent chromium electrolyte.

5. The method according to claim 3, wherein the fourth layer (8) is present.

6. The method according to claim 5, wherein the fourth layer (8) is produced by physical vapor deposition (PVD process).

7. The method according to claim 5, wherein the fifth layer is present, and the fifth layer consists of a mixture of zirconium nitride (ZrN), titanium nitride (TiN) and chromium nitride (CrN).

8. The method according to claim 1, wherein the coating (4) has a brushed texture.

9. The method according to claim 1, further comprising brushing the coating (4).

10. A method for coating, comprising:
a) providing a plumbing component (1) comprising at least one liquid channel (2); and
b) coating an inner surface (3) of the at least one liquid channel (2) with a coating (4),
wherein the coating (4) consists of a first layer (5) consisting of copper directly coated on the inner surface (3) of the at least one liquid channel (2), a second layer (6) consisting of a nickel phosphorus alloy directly coated on the first layer (5), a third layer (7) consisting of chromium directly coated on the second layer (6), a fourth layer (8) consisting of a zirconium compound, a chromium compound or a titanium compound directly coated on the third layer (7), and a fifth layer consisting of a mixture of zirconium nitride (ZrN), titanium nitride (TiN) and chromium nitride (CrN) directly coated on the fourth layer (8).

* * * * *